ated) circuit (chip) and an array of switches (40) is
United States Patent [19]

Bauer

[11] Patent Number: 4,673,933

[45] Date of Patent: Jun. 16, 1987

[54] SWITCH MATRIX ENCODING INTERFACE USING COMMON INPUT/OUTPUT PARTS

[75] Inventor: Jerry R. Bauer, San Jose, Calif.

[73] Assignee: American Microsystems, Inc., Santa Clara, Calif.

[21] Appl. No.: 551,440

[22] Filed: Nov. 14, 1983

[51] Int. Cl.⁴ .............................................. H04Q 1/00
[52] U.S. Cl. ............................ 340/825.94; 340/365 S
[58] Field of Search ................. 84/1.01, 1.03, DIG. 2, 84/7, 8, 20; 340/365 S, 365 R, 825.94, 825.96, 825.79; 307/465; 178/17 A, 17 C; 235/145 R

[56] References Cited

U.S. PATENT DOCUMENTS

| | | | |
|---|---|---|---|
| 3,717,871 | 2/1973 | Hatano et al. | 340/365 S X |
| 3,721,976 | 3/1973 | Kuijsten | 340/365 S |
| 3,778,815 | 12/1973 | Wright | 340/365 S |
| 4,082,923 | 4/1978 | Okuhara | 340/825.96 X |
| 4,231,024 | 10/1980 | Munetsugu | 340/365 S |
| 4,326,194 | 4/1982 | Pepe | 340/365 S X |
| 4,570,154 | 2/1986 | Kinghorn et al. | 340/365 S |

Primary Examiner—Ulysses Weldon

Attorney, Agent, or Firm—Steven F. Caserza; Thomas S. MacDonald; Alan H. MacPherson

[57] ABSTRACT

An encoding interface is provided between input data ports and strobe output ports of a (semiconductor integrated) circuit (chip) and an array of switches (40) is connected to a series of L input data lines and output lines (31–38), whereby the L lines can alternatively strobe the switch matrix to determine the (50) position of each switch. By having each line function either as an input line or an output line at a particular instant of time, the number of switches being served by a fixed number of total input and output lines is increased. For example, with eight total lines 28 switches are accommodated when the lines function either as input or output lines while when four separate lines are dedicated as input lines and four other lines dedicated as output lines only 16 switches are accommodated. In a further embodiment using two switches and a pair of oppositely disposed diodes at each cross point in the matrix the number of switches can be doubled (to 56 with eight dual input/output lines).

7 Claims, 7 Drawing Figures

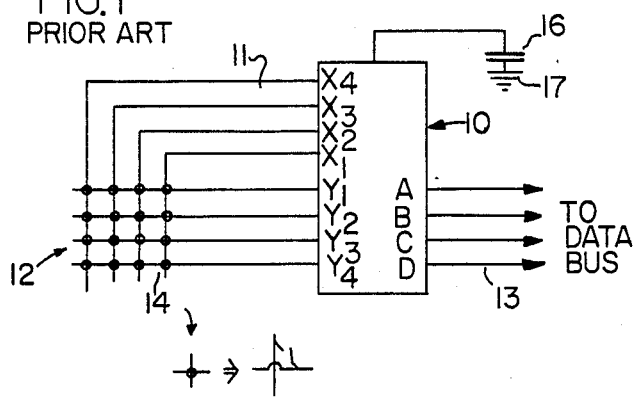
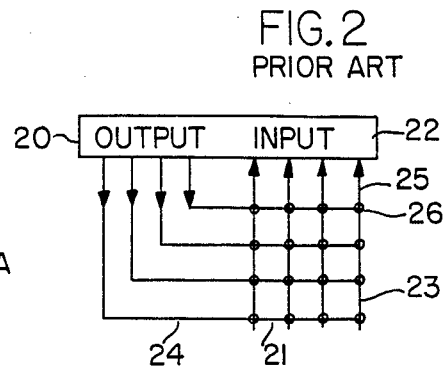
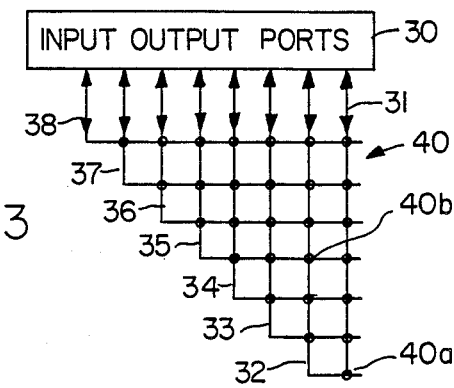
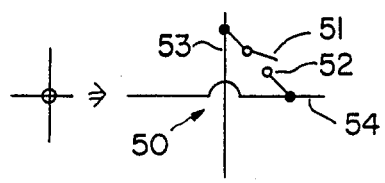
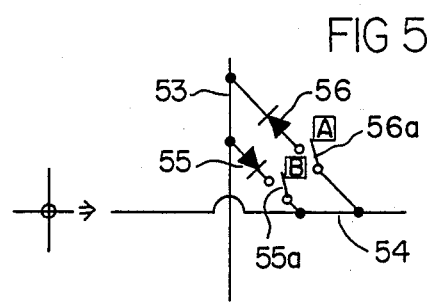
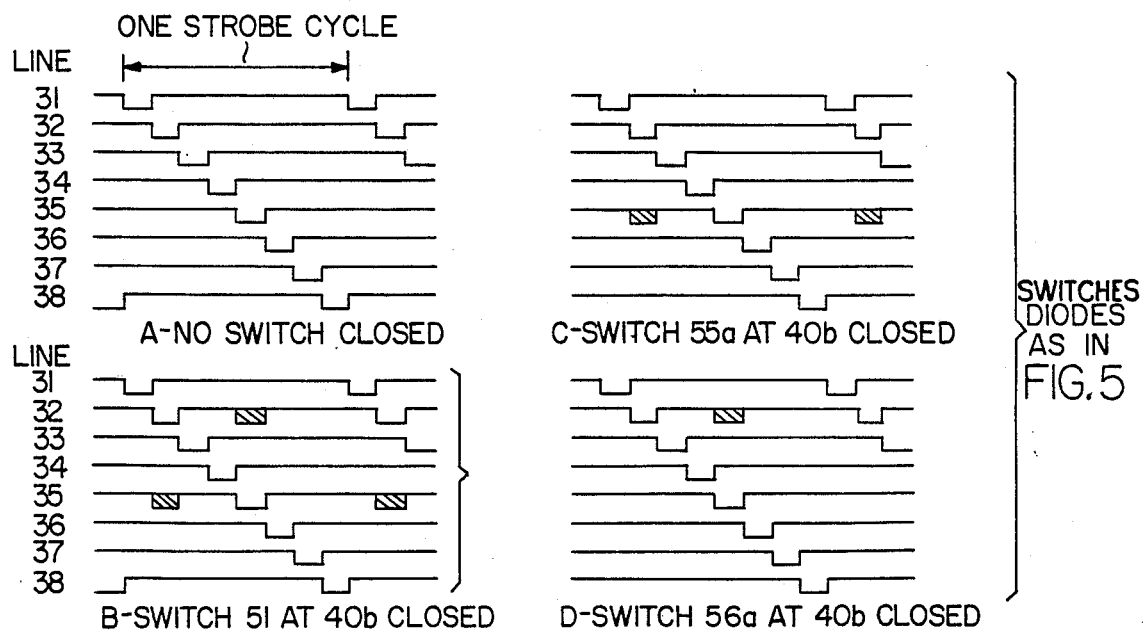

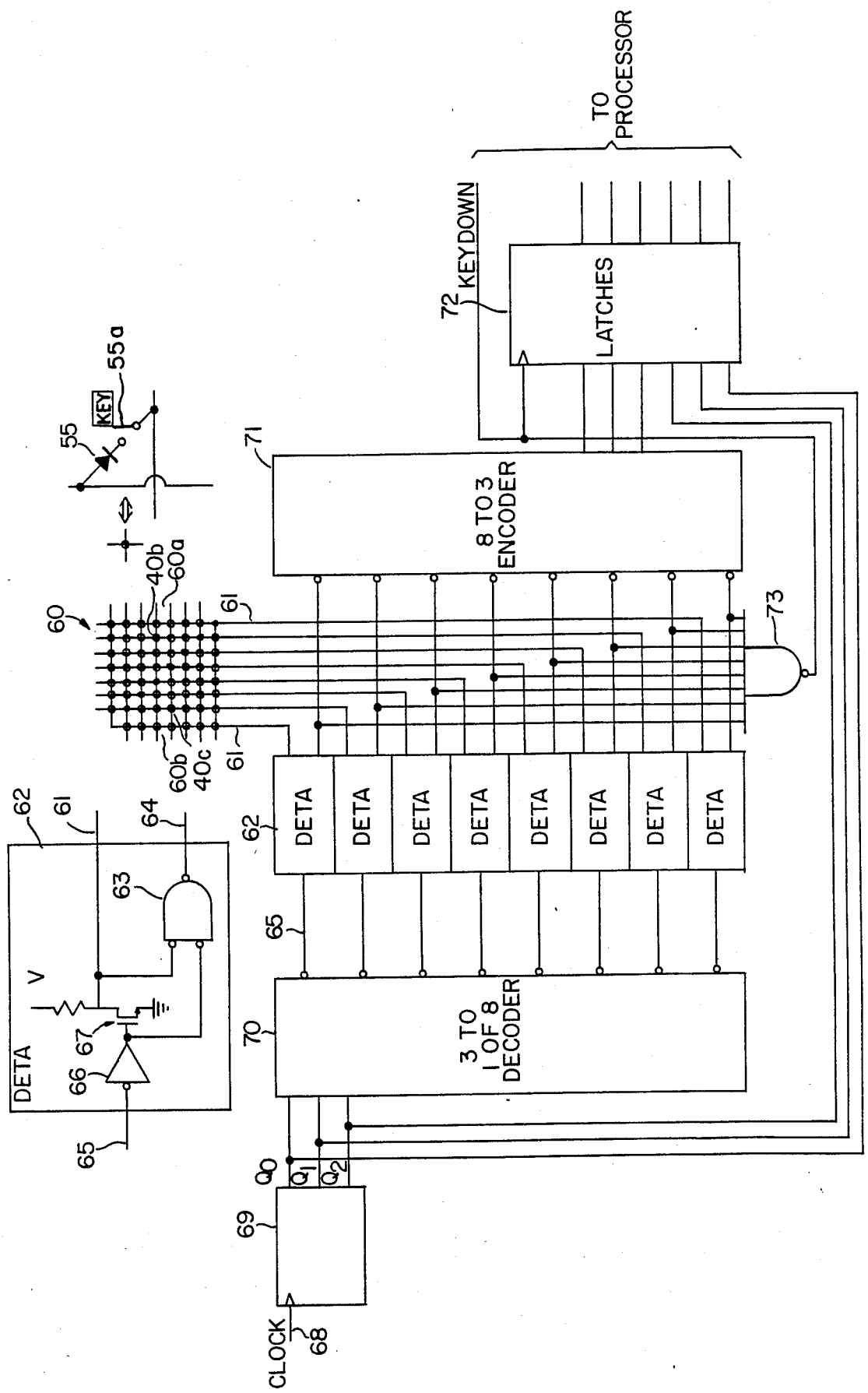

SWITCH MATRIX ENCODING INTERFACE USING COMMON INPUT/OUTPUT PARTS

FIELD OF THE INVENTION

This invention relates to an interface between a plurality of switches and a processor unit, such interface including a plurality of input and output lines.

DESCRIPTION OF THE PRIOR ART

Heretofore, switch matrices have been constructed incorporating a series of output lines extending from output ports of a processing unit to the keyboard contacts and a seperate series of input lines extending from the keyboard contacts back to imput ports of the memory or central processing unit. A rectuangular or square x-y axis matrix of switches has been provided in which, for example, 4 output port lines and 4 input lines—eight lines in all—allow for 16 keys. In general the number of switches (K) equals ($L_{in} \times L_{out}$) where L is the number of lines. The number of lines "in" times the number of lines "out " equals the number of keys accommodated. The ratio of the number of keys to the number of input plus output lines is at a maximum when $L_{in} \times L_{out}$, i.e., $(L/2)^2$.

Prior art devices use separate switch matrix strobe lines (outputs) and switch matrix input lines (data input lines). Each of the above input and output lines requires a pin connection with the respective input port and output port of the processing unit. The processing unit is commonly in the form of an integrated circuit chip, typically in the dual-in-line package (DIP) configuration where pins extend downwardly from the longitudinal side edges of the package. Certain of the pins are chip outputs which are used to drive the key switch matrix along an x-axis and certain other of the pins are the data inputs extending along a key matrix y-axis. An output line and input line are connected via a switch in the switch matrix. Each key incorporates a single pole, single throw switch which, when actuated, allows a signal to flow from one output pin (line) to one input pin (line) through the switch.

SUMMARY

The switch matrix encoding system of this invention provides lines which function in either output or input mode to either strobe the switch matrix or admit a signal. The matrix is organized in a triangular form. By using the same lines for both inputs and outputs, the same number of switch positions can be scanned with fewer pin connections, i.e., it reduces pin count. Alternatively it provides for more switch positions, i.e., larger key arrays can be scanned with the same pin count. In either case there is less complexity and therefore less cost in the improved structure and circuit. It is necessary to add internal control circuitry in the chip to determine whether a given line at a given moment is to be functioning as an input line or as an output line but this circuitry is less a problem and of less cost than the addition of more lines or the use of an appreciabley smaller number of switches. Whereas 8 input and output lines use 8 pin connections and can accommodate 16 keys in the prior art, the present invention uses 8 lines which can function as both input or output in different time increments of operation. This allows connection of eight lines using 28 keys while using a single pole single throw switch with each key. With use of a pair of diodes at each switch position in the matrix the number of keys can be doubled to 56.

BRIEF DESCRIPTION OF THE DRAWINGS

FIG. 1 is a schematic diagram of a prior art integrated circuit/keyboard interface.

FIG. 2 is a schematic wiring diagram of the prior art keyboard matrix interface.

FIG. 3 is a schematic wiring diagram of the keyboard matrix interface in accordance with the present invention.

FIG. 4 is a schematic view of an individual key switching means used in the keyboard matrix of the present invention.

FIG. 5 is a schematic view of an alternative embodiment of switching means used in the keyboard matrix of the present invention.

FIG. 6 is a schematic circuit diagram of the electronic controls for the keyboard matrix interface of this invention in a typical application.

FIG. 7 shows A-D as graphical representations of strobing with the switches in various on-off positions.

DETAILED DESCRIPTION

Referring to the drawings, a prior art integrated circuit chip/switch matrix interface is shown in FIG. 1. An integrated circuit chip 10 has a series of input ports $x_1$, $x_2$, $x_3$, $x_4$, representing a switch matrix column and a series of output ports $y_1$, $y_2$, $y_3$, $y_4$ representing a switch matrix row which are connected by suitable leads 11 to a switch matrix 12. Connection is made from the switch matrix normally through a flat flexible cable having plug-in sockets which connect to the pin contacts extending from a dual-in-line integrated circuit chip. Other pin contacts provide power input, counter and clock pulses and data strobe control (not shown). Chip data output pins A, B, C, D are connected to leads 13 leading to a data bus. The above device typically forms part of a switch encoder which can encode an array of single pole, single throw (SPST) switches 14. A key bounce eliminator (KBE) comprising a capacitor 16 and ground 17 is also shown. Key bounce elimination is commonly done algorithmically (in software) in processor-based scanning schemes.

A prior art switch matrix shown in FIG. 2 is employed in the FIG. 1 interface. Output ports 20 representing pins $Y_1$–$y_4$ corresponding to the horizontal rows 21 of the switch matrix and input ports 22 representing pins $x_1$–$x_4$ corresponding to the vertical columns 23 of the switch matrix, use separate switch matrix strobe lines 24 (outputs) and switch matrix input lines 25 (data lines), respectively. The switches are provided in a rectangular matrix of rows 21 and columns 23 with a separate SPST switch at each intersection of a strobe and input line.

When the switch matrix is strobed by the outputs 20 through lines 24, an input signal is sensed on an input line 25 if a switch 26, for example, is closed. As shown 8 lines can employ 16 switches. In general the greatest number of switches (K) equals $(L/2)^2$ where L is the total number of lines, or $L_{in} \times L_{out} = K$ where $L_{in}$ is the number of input lines and $L_{out}$ is the number of output lines for a nonsquare array. Thus a sixteen switch matrix necessitates the use of at least eight pin connections on the chip.

FIG. 3 illustrates the present invention wherein a half-rectangular (triangular) array of switches are provided and each line functions alternatively as either an input or output line, herein noted as I/O lines. By using I/O lines the same number of switch positions can be scanned with fewer pin connections or more switch positions can be scanned with the same pin count. Eight I/O lines 31 through 38 extend from corresponding ports or pins in chip 30 to vertically intersect from zero to n-1 switches, where n equals the total number of I/O lines, in columns of switches 40. The lines extend thereafter through switches at each intersection to horizontally intersect from n-1 to one switches per row. For example, line 31 intersects seven switches vertically including bottom switch, 40a and extending line 31 horizontally it intersects and one switch, again switch 40a while line 34 intersects four switches vertically and four switches horizontally including switch 40b. Note that each line intersects once with each other line.

I/O control circuitry is provided usually within the chip itself to allow functioning of each line 31–38 either in the strobe (output) mode or data (input) mode. If switch 40b is closed, it is detected when either:

(1) line 35 is strobed (as an output) and line 32 is sensed (as an input); or
(2) line 32 is strobed (as an output) and line 35 is sensed (as an input)

These two conditions are differential in the scheme of FIG. 5. The strobing continues on lines 32 through 38 in order to sense switch closings in any other positions. The I/O control circuit permits alternative signal flow through the respective lines 31 through 38. "Switch" or "key/siwtch" as used herein may be a mechanical switch as illustrated or a relay, transistor, photodetector or other controller of electrical current flow which operates in an "on" or "off" binary fashion.

With the above described common dual functioning I/O lines eight lines can employ 28 switches, up from the 16 switches possible in the four separate input lines and four separate output line of the prior art. In general with common I/O lines $K=(L^2-L)/2$ where L=number of I/O lines and K=number of switches.

FIG. 4 illustrates the SPST switch 50 provided at each intersection. Closing a switch moves switch operator 51 into contact with terminal 52 completing the circuit and allows a signal to be conducted from a vertical column line 53 to a horizontal row line 54 or vice versa dependent on whether a line is functioning at that moment as an output or input line. FIG. 5 illustrates a further embodiment where a pair of diodes 55 and 56 are provided in the matrix, the pair allowing electrical flow from either a column to a row or a row to a column. This can be done by providing a positive strobe voltage on line 54 through diode 56 or by providing a negative voltage on line 54 so current flows from line 53 to line 54. When switch 55a is closed, the flow of current from line 54 to line 53 will be prevented by the blocking action of diode 55. When switch 56a is closed, diode 56 permits flow of the electrical signal. Each diode/switch combination is separately controlled, allowing doubling of the number of switches with the same number of lines or halving the numbers of lines (and pin connections) for the same number of switches. In this embodiment, K in general will equal $L^2-L$. Thus, for example, eight I/O lines can accommodate 56 switches.

FIG. 6 is a schematic in block form of a switch array and integrated circuit chip application. It includes a switch array 60 with an 8×8 square matrix made up of two triangular arrays 60a and 60b, thus allowing 56 switches in a minimum space when eight I/O lines are used. A diode is positioned in series with each switch. This matrix operates with the waveforms C and D shown in FIG. 7.

Each of the I/O lines 61 is connected by pin connection to an OR gate strobe/detector circuit 62 which is repeated 8 times on the chip. OR gate 63 determines a particular line is strobing or sensing. One of the eight lines performs a strobing function while the other seven lines are being sensed. Each line in turn is placed in the strobing mode. The detail of the strobe/detector circuit is shown in the upper block in FIG. 6. The state of OR gate 63 determines which of the particular lines 61 is strobing with the others sensing. A signal representing a logical 0 or logical 1 is impressed on line 65, fed into an inverter 66 and this inverted signal is received by the gate of a MOS transistor 67. A clock pulse 68 increments a 3 bit counter 69 from 000 to 111 in eight steps and the counter output $Q_0$, $Q_1$, and $Q_2$ is fed to a 3 to 1 of 8 decoder 70 such as a Model #74138 from Texas Instruments, Inc., which in turn sends a logical 0 or logical 1 pulse on line 65 to each strobe/detector circuit 62. In the strobe mode a logical 0 is impressed on line 65 of a first strobe/detector circuit 62 selected by decoder 70, and is inverted to a logical 1 by inverter 66. The logical 1 from inverter 66 is applied to the gate of MOS transistor 67 in strobe/detector circuit 62 which renders MOS transistor 67 nonconductive and provides voltage +V on line 61. When a second strobe/detector circuit 62, operating in the sensing mode, is connected to the first strobe/detector circuit via a closed switch array 60, the voltage +V on line 61 of the first strobe/detector circuit is applied to line 61 of the second strobe/detector circuit. While a strobe/detector circuit 62 is operating in the sensing mode, a logical 1 is applied by decoder 70 to line 65 which causes inverter 66 to provide a logical 0 to the gate of MOS transistor 67, rendering transistor 67 conductive and thus providing a current sink from line 61 to ground. A logical 0 is thereby placed on one input lead of OR gate 63. A second input lead of OR gate 63 receives a logical 0 from inverter 66. Thus, in the sensing mode, a logical 0 is output on line 64 from the strobe/detector circuit 62. The output signal on line 64 is then applied to an 8 to 3 encoder 71 such as a Model #74148 from Texas Instruments, Inc., whose output is latched by latch 72 and fed, for example, to a processor. The encoder 71 determines which of the seven lines, if any, resoponds to the strobe and places the identity of that line into 3 bits of information, e.g., 001 etc. This signal latches the switch number to be presented to the processor and tells the processor that there is a particular switch closed. A switch closed feature is included comprising a gate 73 which responds if any key is depressed and indicates this as an interrupt to the host processor. Such gate is internal to a 74148. The speed of strobing is typically conditioned in the case of manual data entry on how fast the data inputs are expected to change, i.e., how fast the typist will be typing. The system described above is not tolerant of multiple simultaneous switch closures but modifications of the system by those skilled in the art would permit such operation.

FIG. 7 is a graphical representation of strobing of the switch matrix lines 31 through 38. Case A illustrates when no switch is closed. Each of lines 31–38 are incrementally strobed in a cyclic fashion. In Case B switch 51 (FIG. 4) is closed at location 40b (FIG. 3) with the result that when line 32 is in the strobe mode having been forced low (the other lines then being in a sensing mode) and a sensed signal is impressed on line 35 it means that a switch is closed at the intersection of lines 35 and 32. In Cases C and D switches 55a and 56a (FIG. 5) are alternately closed at positions 40b and 40c on each of the triangular subarrays of the matrix shown in FIG. 6. In Case C the diode 55 blocks the flow of current even if switch 55a is closed so that a signal is sensed on line 35 but not sensed in any of the other seven lines while in Case D the diode 56 permits current flow when switch 56a is closed (at location 40c), which flow is sensed on line 32.

While the invention has been described in terms of normal data entry, it can also be applied to a musical instrument keyboard or a number of mechanical sensors, as in an alarm system or automated control of machinery. The switches may be in the form of switches of the mechanical type or transistors for turning the flow of current on or off in automatic machinery industrial controllers, such as limit switches on a drill press. The switch array may be a read-only-memory (ROM) which can be accessed by the described apparatus. The ROM is scanned by the system to see the state of each of the switches.

The above description of embodiments of this invention is intended to be illustrative and not limiting. Other embodiments of this invention will be obvious to those skilled in the art in view of the above disclosure.

I claim:

1. A circuit comprising:
   a series of input/output ports;
   a matrix of switch means;
   multiple common input/output lines connected between said input/output ports and said switch means, each switch means connected between a pair of said common input/output lines such that the state of each said switch means can be scanned;
   means for strobing each of said multiple common input/output lines in turn; and
   means for recognizing on each said input/output port, only at a time when that input/output port is not being strobed, a signal from any other input/output port which is being strobed, the presence of said signal indicating that a switch means connected between said common input/output lines to said input/output port being strobed and said input/output port not being strobed is closed, and thereby determining which switch means is closed;
   wherein said matrix of switch means comprises a pair of switch means connecting the intersection of each of said common input/output lines, a diode connected to each of said switch means to permit electrical flow in opposite directions therethrough, and separate control means operable over each of said switch means to permit electrical flow in opposite directions through each of said common input/output lines; and
   wherein each common input/output line intersects from zero to L-1 of said switch means, where L is the total number of said common input/output lines.

2. The invention of claim 1 in which the number of said control means in the matrix equals $L^2 - L$ where L is the total number of said common input/output lines.

3. The invention of claim 1 in which said matrix of switch means is a matrix of keys in a keyboard.

4. The invention of claim 1 further including means for controlling the electrical flow in said common input/output lines over a particular time increment, whereby one of the said common input/output lines functions as an input line and the remaining said common input/output lines function as output lines during that time increment.

5. The invention of claim 4 in which said control means comprises a strobe/detector circuit for each of said common input/output lines, said circuit being accessed by timed pulses which strobe said common input/output lines.

6. The invention of claim 1 in which said matrix of switch means are operable by a matrix of keys.

7. The invention of claim 6 in which said matrices of switch means and keys are of triangular organization.

* * * * *